United States Patent
Boyanov et al.

(10) Patent No.: US 9,112,029 B2
(45) Date of Patent: *Aug. 18, 2015

(54) STRAINED TRANSISTOR INTEGRATION FOR CMOS

(71) Applicant: INTEL CORPORATION, Santa Clara, CA (US)

(72) Inventors: Boyan Boyanov, San Diego, CA (US); Anand S. Murthy, Portland, OR (US); Brian S. Doyle, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,938

(22) Filed: May 2, 2014

(65) Prior Publication Data

US 2014/0239345 A1 Aug. 28, 2014

Related U.S. Application Data

(63) Continuation of application No. 13/764,675, filed on Feb. 11, 2013, now Pat. No. 8,748,869, which is a continuation of application No. 12/609,711, filed on Oct. 30, 2009, now Pat. No. 8,373,154, which is a continuation of application No. 10/747,321, filed on Dec. 23, 2003, now Pat. No. 7,662,689.

(51) Int. Cl.
  *H01L 29/08* (2006.01)
  *H01L 21/8238* (2006.01)
  (Continued)

(52) U.S. Cl.
  CPC ........ *H01L 29/7849* (2013.01); *H01L 21/0245* (2013.01); *H01L 21/0251* (2013.01);
  (Continued)

(58) Field of Classification Search
  CPC .................... H01L 21/02381; H01L 21/02532; H01L 21/0262; H01L 21/0245; H01L 21/025; H01L 21/02636; H01L 29/78
  See application file for complete search history.

(56) References Cited

U.S. PATENT DOCUMENTS

| 4,599,789 A | 7/1986 | Gasner |
| 4,619,033 A | 10/1986 | Jastrzebski |

(Continued)

FOREIGN PATENT DOCUMENTS

| DE | 69730625 | 2/2005 |
| EP | 0829908 | 3/1998 |

(Continued)

OTHER PUBLICATIONS

Intel Corporation, Non Final Office Action mailed Oct. 16, 2007; U.S. Appl. No. 10/747,321.

(Continued)

*Primary Examiner* — Colleen A Matthews
*Assistant Examiner* — Quovaunda V Jefferson
(74) *Attorney, Agent, or Firm* — Blakely, Sokoloff, Taylor & Zafman LLP

(57) ABSTRACT

Various embodiments of the invention relate to a CMOS device having (1) an NMOS channel of silicon material selectively deposited on a first area of a graded silicon germanium substrate such that the selectively deposited silicon material experiences a tensile strain caused by the lattice spacing of the silicon material being smaller than the lattice spacing of the graded silicon germanium substrate material at the first area, and (2) a PMOS channel of silicon germanium material selectively deposited on a second area of the substrate such that the selectively deposited silicon germanium material experiences a compressive strain caused by the lattice spacing of the selectively deposited silicon germanium material being larger than the lattice spacing of the graded silicon germanium substrate material at the second area.

19 Claims, 2 Drawing Sheets

(51) Int. Cl.
*H01L 29/12* (2006.01)
*H01L 31/0312* (2006.01)
*H01L 27/092* (2006.01)
*H01L 29/78* (2006.01)
*H01L 21/02* (2006.01)

(52) U.S. Cl.
CPC ...... *H01L21/0262* (2013.01); *H01L 21/02381* (2013.01); *H01L 21/02532* (2013.01); *H01L 21/02636* (2013.01); *H01L 27/092* (2013.01); *H01L 29/78* (2013.01)

(56) References Cited

U.S. PATENT DOCUMENTS

| | | | |
|---|---|---|---|
| 5,155,571 | A | 10/1992 | Wang et al. |
| 5,891,769 | A | 4/1999 | Liaw et al. |
| 6,051,471 | A * | 4/2000 | Gardner et al. ............... 438/286 |
| 6,064,081 | A | 5/2000 | Robinson et al. |
| 6,174,775 | B1 | 1/2001 | Liaw |
| 6,200,866 | B1 | 3/2001 | Ma et al. |
| 6,267,479 | B1 | 7/2001 | Yamada et al. |
| 6,274,444 | B1 | 8/2001 | Wang |
| 6,339,232 | B1 | 1/2002 | Takagi |
| 6,342,421 | B1 | 1/2002 | Mitani et al. |
| 6,348,386 | B1 * | 2/2002 | Gilmer .......................... 438/288 |
| 6,350,993 | B1 | 2/2002 | Chu et al. |
| 6,429,061 | B1 | 8/2002 | Rim |
| 6,445,043 | B1 | 9/2002 | Chittipeddi |
| 6,600,170 | B1 | 7/2003 | Xiang |
| 6,652,965 | B2 * | 11/2003 | Merigold et al. .............. 428/364 |
| 6,703,271 | B2 | 3/2004 | Yeo et al. |
| 6,734,072 | B1 | 5/2004 | Chong et al. |
| 6,764,908 | B1 * | 7/2004 | Kadosh et al. ................ 438/285 |
| 6,878,592 | B1 | 4/2005 | Besser et al. |
| 6,878,611 | B2 | 4/2005 | Sadana et al. |
| 2001/0045604 | A1 | 11/2001 | Oda et al. |
| 2002/0011603 | A1 | 1/2002 | Yagishita et al. |
| 2002/0024152 | A1 | 2/2002 | Momoi et al. |
| 2002/0079507 | A1 | 6/2002 | Shim et al. |
| 2002/0172768 | A1 | 11/2002 | Endo et al. |
| 2002/0177244 | A1 | 11/2002 | Hsu et al. |
| 2003/0003679 | A1 * | 1/2003 | Doyle et al. .................. 438/406 |
| 2003/0102490 | A1 | 6/2003 | Kubo et al. |
| 2003/0153161 | A1 | 8/2003 | Chu |
| 2003/0162348 | A1 | 8/2003 | Yeo |
| 2004/0026765 | A1 * | 2/2004 | Currie et al. .................. 257/616 |
| 2004/0175872 | A1 | 9/2004 | Yeo et al. |
| 2004/0178406 | A1 * | 9/2004 | Chu ................................ 257/19 |
| 2005/0104131 | A1 | 5/2005 | Chidambarrao et al. |

FOREIGN PATENT DOCUMENTS

| | | |
|---|---|---|
| EP | 1174928 | 1/2002 |
| JP | 08023797 | 2/1996 |
| WO | WO-03105204 | 12/2003 |
| WO | WO-2005067014 | 7/2005 |

OTHER PUBLICATIONS

Intel Corporation, Final Office Action mailed Apr. 30, 2008; U.S. Appl. No. 10/747,321.
Intel Corporation, Non Final Office Action mailed Aug. 28, 2008; U.S. Appl. No. 10/747,321.
Intel Corporation, Non Final Office Action mailed Sep. 27, 2005; U.S. Appl. No. 10/747,321.
Intel Corporation, Final Office Action mailed Jan. 10, 2006; U.S. Appl. No. 10/747,321.
Intel Corporation, Non Final Office Action mailed Jun. 30, 2006; U.S. Appl. No. 10/747,321.
Intel Corporation Non Final Office Action mailed Mar. 1, 2007; U.S. Appl. No. 10/747,321.
Intel Corporation, Final Office Action mailed Jul. 25, 2007; U.S. Appl. No. 10/747,321.
Van Zant, Peter, "Microchip Fabrication: A Practical Guide to Semiconductor Processing", 4th Edition, McGraw Hill Companies, pp. 510-511, 2000.

* cited by examiner

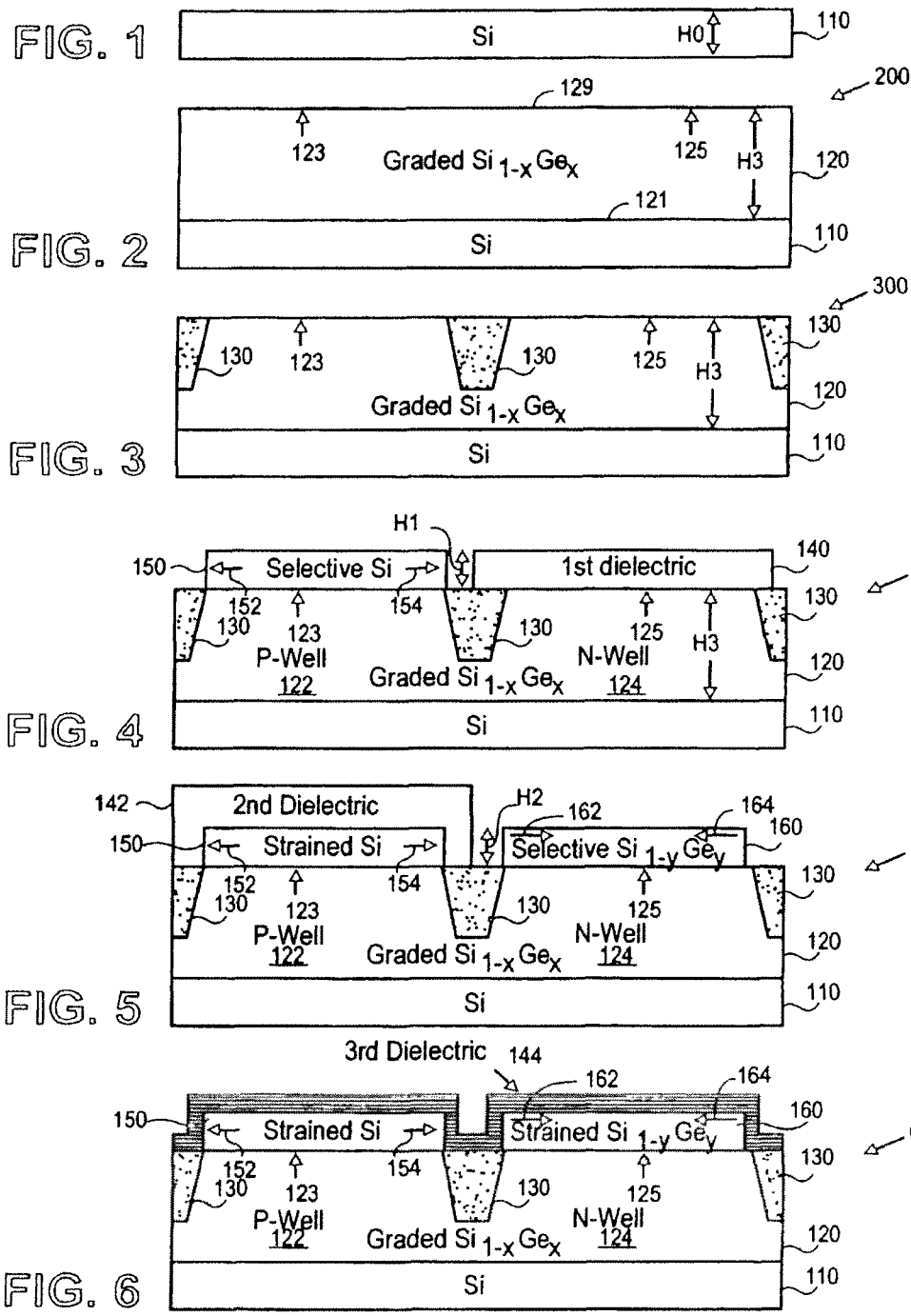

STRAINED TRANSISTOR INTEGRATION FOR CMOS

CROSS REFERENCE TO RELATED APPLICATIONS

This application is a continuation of pending U.S. application Ser. No. 13/764,675, filed Feb. 11, 2013, which issued as U.S. Pat. No. 8,748,869 on Jun. 10, 2014, which is a continuation of U.S. application Ser. No. 12/609,711, filed Oct. 30, 2009 (issued as U.S. Pat. No. 8,373,154), which is a continuation of U.S. patent application Ser. No. 10/747,321, filed Dec. 23, 2003 (issued as U.S. Pat. No. 7,662,689), and incorporated herein by reference.

FIELD

Circuit devices and the manufacture and structure of circuit devices.

BACKGROUND

Increased performance of circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor semiconductor devices, such as those used in a complementary metal oxide semiconductor (CMOS), it is often desired to increase movement of electrons in N-type MOS device (NMOS) channels and to increase movement of positive charged holes in P-type MOS device (PMOS) channels.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

FIG. 1 is a schematic cross section view of a portion of a semiconductor substrate base.

FIG. 2 is the semiconductor substrate of FIG. 1 after forming a layer of graded silicon germanium material on the substrate.

FIG. 3 shows the semiconductor substrate of FIG. 2 after forming an electronically insulating material between areas of the graded silicon germanium material.

FIG. 4 shows the semiconductor substrate of FIG. 1 after selective deposition of a layer of silicon material over a first area of the graded silicon germanium material.

FIG. 5 shows the semiconductor substrate of FIG. 1 after selective deposition of a layer of silicon germanium material over a second area of the graded silicon germanium material, where the silicon germanium material has a higher concentration of germanium than the graded silicon germanium material has at the second area.

FIG. 6 shows the semiconductor substrate of FIG. 1 after forming a layer of high dielectric constant material over the selectively deposited silicon and the selectively deposited silicon germanium material.

DETAILED DESCRIPTION

Figure 7:
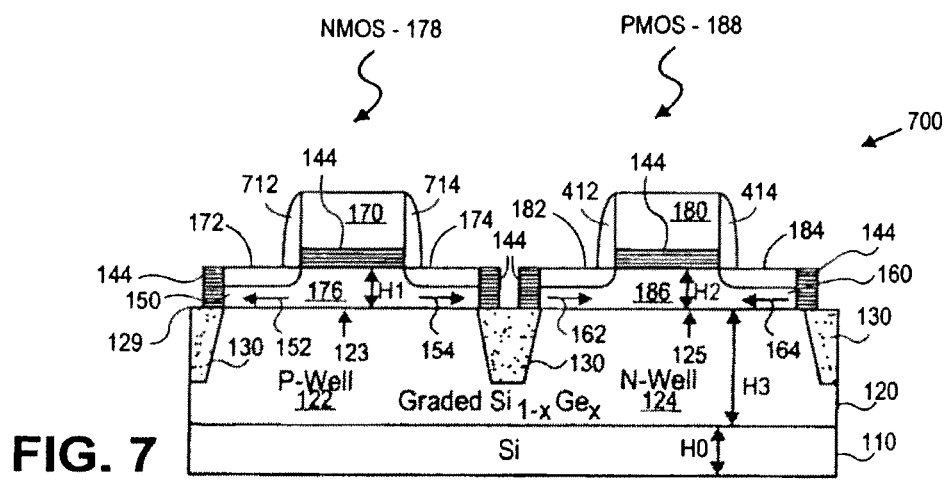
FIG. 7 shows the semiconductor substrate of FIG. 1 after forming an NMOS device in the selectively deposited silicon material, and a PMOS device in the selectively deposited silicon germanium material.

FIG. 1 is a schematic cross section view of a portion of a semiconductor substrate base. As shown in FIG. 1, silicon base 110 may include, be formed from, or grown from polycrystal silicon, single crystal silicon, or various other suitable technologies for forming a silicon base or substrate, such as a silicon wafer. For example, according to embodiments, base 110 may be formed by growing a single crystal silicon substrate base material having thickness H0 of between 100 angstroms and 1,000 angstroms of pure silicon.

FIG. 2 is the semiconductor substrate of FIG. 1 after forming a layer of graded silicon germanium (SiGe) material on the substrate. FIG. 2 shows substrate material 120 of graded silicon germanium formed on top of substrate base 110. For example, substrate material 120 may be a layer of graded relaxed silicon alloy material formed by chemical vapor deposition (CVD) epitaxial growth of graded relaxed SiGe in a chamber, such as a semiconductor device fabrication chamber. More specifically, such CVD growth may be accomplished by placing substrate base 110 into the chamber, heating the inside of the chamber to a temperature between 500 Celsius and 1,000 Celsius in a hydrogen ambient flow ($H_2$) of between 5 standard liters per minute (SLM) and 50 SLM, pressurizing the chamber to a pressure between 10 Torr and 200 Torr (e.g., such as either by atmospheric or reduced pressure), flowing into the chamber a silicon precursor (e.g., such as the silicon precursor described herein) at a flow into the chamber of between 50 SCCM and 500 SCCM, and slowly increasing a flow of germanium precursor from 0 SCCM to a final value sufficient to cause upper surface 129 to have a percentage of germanium between 10% and 35% germanium. More particularly, the flow of germanium precursor may be increased sufficiently to cause a grading of germanium from 0% initial concentration of germanium, such as at lower surface 121, to increase to between 20% and 30% final concentration germanium, such as at upper surface 129 at for instance, a grading rate of change of germanium concentration of 10% germanium per micrometer in depth (e.g., such as per micrometer in depth of thickness H3). According to embodiments, it is considered that substrate material 120 may have a concentration of germanium, such as at upper surface 129, of between 5% and 20% final concentration germanium.

Thus, according to embodiments, the grading rate, and/or thickness of the graded silicon germanium material may be varied to provide a selected final concentration of germanium at upper surface 129 resulting from a selected grading rate initiated at lower surface 121. Moreover, according to embodiments, the grading rate may be established by a continuous change in grading, a linear change in grading, a non-linear change in grading, and/or a step-grading change of germanium concentration in substrate material 120. Specifically, for example, the flow of germanium precursor can be increased so that the grading rate increases smoothly and continuously, or so that the grading rate has an abrupt step-grading change of germanium concentration in substrate material 120 of between 1% and 2% increments every 1,000 to 2,000 angstroms. Additionally, according to embodiments, the initial flow of germanium precursor, increase in flow of germanium precursor, and final flow of germanium precursor may be selected and may vary widely depending on the desired final target concentration of germanium in substrate material 120 (e.g., such as at upper surface 129), the temperature used during formation, and the concentration of the germanium precursor.

For instance, in one embodiment, the germanium precursor may be germane ($GeH_4$) and may be increased in flow linearly, or non-linearly versus time to achieve a selected grading profile, and may be increased to a final flow value sufficient to cause upper surface 129 to have a selected percentage of germanium. Also, the germanium precursor may be a germane precursor diluted in $H_2$, or may be pure germane increased to a final flow at or below 100 SCCM. In fact, it is possible to increase the flow of germanium precursor to grow a relaxed graded film of silicon germanium with up to 100% germanium at upper surface 129.

Likewise, according to embodiments, substrate material 120 may be graded relaxed silicon germanium material having a grading concentration that increases from 0% at lower surface 121 to between 10% and 30% at upper surface 129, at a rate of between 5% and 15% increase in germanium per micrometer in depth (e.g., such as in depth related to thickness H3). Graded relaxed silicon germanium, includes graded silicon germanium in a "relaxed" status such as where the alignment of silicon and germanium molecules in the SiGe structure (substrate base 110 plus substrate material 120) have relatively few dislocations, even where the percentage of Ge grading increases (e.g., such as increasing via smooth or step grading).

Also, according to embodiments, forming graded relaxed silicon germanium may include flowing between 50 SCCM and 100 SCCM of HCl during CVD epitaxial growth of substrate material 120. For example, a sufficient amount of HCl may be introduced during formation of substrate material 120 to increase or improve the planarity of upper surface 129, to reduce or control so-called "cross-hatch" that develops during relaxed silicon germanium growth (e.g., such as to reduce the crisscross strain or grid pattern in or at upper surface 129 that may be attributed to relaxation of silicon germanium molecules during deposition). Furthermore, according to embodiments, although substrate material 120 is described above as being formed of graded silicon germanium, substrate material 120 may be formed by CVD epitaxial growth, ultrahigh vacuum (UHV) CVD epitaxial growth, and/or molecular beam epitaxy (MBE) epitaxial growth of various appropriate silicon alloys (e.g., such as silicon germanium). Thus, for example, substrate material 120 may be formed by sufficient CVD of various appropriate silicon alloy materials to form a graded relaxed layer of silicon alloy material having a thickness between 1 and 3 micrometers in thickness, such as by CVD of silicon germanium to form graded substrate material 120 having a thickness H3 of 2 micrometers in thickness. Moreover, substrate material 120 may be formed by an appropriate layer transfer/bonding techniques, such as a substrate SiGe On Insulator (SGOI) process where a relaxed SiGe substrate is prepared by growing SiGe on a bulk substrate by an appropriate process and then transferring a relaxed top layer of the SiGe to a different substrate (e.g., such as to substrate base 110, which may be a silicon oxide wafer) to form substrate material 120. It is also considered that substrate material 120 may be non-graded silicon alloy material.

FIG. 2 also shows substrate material 120 having first area 123 and second area 125 of upper surface 129, which are suitable for depositing a transistor device semiconductor channel material onto. For example, FIG. 3 shows the semiconductor substrate of FIG. 2 after forming an electronically insulating material between areas of the graded silicon germanium material. FIG. 3 shows shallow trench isolation (STI) material 130 between first area 123 and second area 125. Although FIG. 3 shows STI material 130 between first area 123 and second area 125, various appropriate electronically insulating materials and structures sufficient for isolating a P-type well of a CMOS device from an N-type well of the CMOS device are contemplated.

Next, according to embodiments, substrate material 120 may be doped at first area 123 with one of boron and aluminum to form a P-type well region 122 having an electrically positive charge, such as for a an NMOS transistor of a CMOS device. Similarly, substrate material 120 may be doped at second area 125 with phosphorous, arsenic, and/or antimony to form N-type well region 124 having an electrically negative charge, such as for a PMOS transistor of a CMOS device. To selectively dope first area 123 and second area 125, a mask may be placed over the non selected area to block the introduction of deposit into the non selected area.

After P-type well region 122 and N-type well region 124 are formed in substrate material 120, a layer of silicon material having a thickness suitable as a first channel for a first circuit device on first area 123 of substrate material 120 may be formed to define a first interface surface of substrate material 120. In addition, a layer of silicon germanium material suitable as a second channel for a second circuit device on second area 125 of substrate material 120 may be formed to define a second interface surface of substrate material 120. For example, FIG. 4 shows the semiconductor substrate of FIG. 1 after selective deposition of a layer of silicon material over a first area of the graded silicon germanium material. FIG. 4 shows first dielectric layer 140 formed over second area 125 of substrate material 120. According to embodiments, first dielectric layer 140 may be formed of a material such as an etch stop and/or dielectric material, including silicon dioxide ($SiO_2$), silicon nitride ($Si_3N_4$), an etch stop dielectric, or other suitable dielectric.

After forming first dielectric layer 140, first layer 150 may be formed over first area 123 of substrate material 120. For example, as shown in FIG. 4, first layer 150 is an epitaxial layer of silicon material formed by selective CVD epitaxial growth of tensile strained silicon, such as a layer of silicon experiencing a tensile strain in directions of arrows 152 and 154 caused by a lattice spacing of the silicon material being smaller than a lattice spacing of the relaxed graded silicon germanium substrate material 120 at first area 123. Selective CVD epitaxial growth of the silicon layer may include placing structure 400 without first layer 150, into a chamber, heating the inside of the chamber to a temperature between 600 Celsius and 900 Celsius in a hydrogen ambient flow ($H_2$) of between 5 SLM and 50 SLM, pressurizing the chamber to a pressure between 10 Torr and 200 Torr (e.g., such as by pressurizing either to atmospheric or reduced pressure), and flowing into the chamber a silicon precursor at a flow of between 50 SCCM and 500 SCCM to form an epitaxial layer of silicon material having a thickness H1 between 10 nano-meters and 20 nano-meters in thickness. For example, first layer 150 may have a thickness sufficient to avoid dislocations, misfits, or threaded dislocations between first layer 150 and substrate material 120 at a first interface defined where first layer 150 is coupled to upper surface 129 of substrate material 120 at first area 123.

More particularly, forming first layer 150 may include flowing dichlorosilane ($SiH_2Cl_2$) to selectively deposit silicon material having a thickness H1 of between 100 angstroms and 1,000 angstroms of pure silicon. Moreover, it is contemplated that forming of first layer 150 may include introducing between 50 SCCM and 500 SCCM of HCl, such as by flowing HCl during selective CVD epitaxial growth of tensile strain silicon (e.g., such as is described above with respect to forming substrate material 120). Furthermore, according to embodiments, although first layer 150 is described above as being formed by CVD epitaxial growth, first layer 150 may be formed by other appropriate processes including UHV CVD epitaxial growth, SGOI, and/or MBE epitaxial growth, such as those described herein, to form a layer of silicon.

Also, according to embodiments, first layer 150 may include various other appropriate silicon material that will experience a tensile strain when formed on first area 123.

After forming first layer 150, a second dielectric layer may be formed over first layer 150, and then a layer of silicon germanium material suitable as a second channel for a second circuit device may be formed on second area 125 of substrate material 120. For example, FIG. 5 shows the semiconductor substrate of FIG. 1 after selective deposition of a layer of silicon germanium material over a second area of the graded silicon germanium material, where the silicon germanium material has a higher concentration of germanium than the graded silicon germanium material has at the second area. FIG. 5 shows different second layer 160 suitable as a second channel for a second circuit device formed on second area 125 of graded silicon germanium substrate material 120, and second dielectric layer 142 conformally formed over first layer 150 at first area 123. According to embodiments, second dielectric layer 142 may be formed of a material, by a process, and to a thickness, such as described above for first dielectric layer 140. For example, second dielectric layer 142 may be conformally deposited over the surface of first layer 150 in that the thickness of second dielectric layer 142 is consistent throughout and conforms to the topography of the surface of first layer 150.

In particular, FIG. 5 shows second layer 160, such as an epitaxial layer of silicon alloy material that may be formed by selective CVD epitaxial growth of compressive strained silicon germanium. For example, second layer 160 may be formed by selective CVD epitaxial growth by placing structure 500 without second layer 160 into a chamber, heating the chamber inside to a temperature between 500 Celsius and 800 Celsius in a hydrogen ambient flow ($H_2$) of between 5 SLM and 50 SLM, pressurizing the chamber to a pressure between 10 Torr and 200 Torr (e.g., such as pressurizing to atmospheric or reduced pressure), flowing into the chamber a silicon precursor at a flow rate of between 50 SCCM and 500 SCCM, and flowing into the chamber a germanium precursor at a flow rate of up to 100 SCCM (undiluted) to cause second layer 160 to have a percentage of germanium between 20% and 60%. Thus, second layer 160 may be formed, such as with a sufficient percentage of germanium, to cause second layer 160 to experience a compressive strain in directions of arrows 162 and 164 due to a lattice spacing of epitaxial layer of silicon alloy material being larger than a lattice spacing of graded silicon germanium substrate material 120 at second area 125. Specifically, formation of second layer 160 can include flowing a germanium precursor at a rate such that second layer 160 is an epitaxial layer of silicon germanium material having a thickness H2 of between 10 nano-meters and 20 nano-meters in thickness. Therefore, second layer 160 may have a thickness sufficient to avoid dislocations, misfits, or threaded dislocations at a second interface defined by where second layer 160 is coupled to upper surface 129 of substrate material 120 at second area 125.

It can be appreciated that flowing a silicon precursor for forming second layer 160 may include flowing a precursor and/or flowing at a rate such as is described above with respect to flowing a silicon precursor to form substrate base 110 and first layer 150. More particularly, for example, the silicon precursor described above for forming second layer 160 may be dichlorosilane ($SiH_2Cl_2$) flown at a rate sufficient so that when combined with the flowing of the germanium precursor, a silicon germanium material may be formed to provide second layer 160 having thickness H2 of between 100 angstroms and 1,000 angstroms of silicon germanium material. Likewise, flowing of a germanium precursor described above with respect to forming second layer 160 may include flowing a germanium precursor and/or flowing a germanium precursor at a flow rate as described above with respect to flowing a germanium precursor to form graded silicon germanium substrate material 120. Specifically, for instance, flowing a germanium precursor to form second layer 160 may include flowing germane ($GeH_4$) sufficiently to cause second layer 160 to have a selected percentage of germanium and a selected thickness (e.g., such as by flowing germane as described above with respect to forming graded silicon germanium substrate material 120 in FIG. 2).

Moreover, it is contemplated that forming second layer 160 may include introducing between 50 SCCM and 500 SCCM of HCl, such as is described above with respect to forming first layer 150 at FIG. 4. Furthermore, according to embodiments, although second layer 160 is described above as being formed of graded silicon germanium, second layer 160 may be formed by CVD epitaxial growth, UHV CVD epitaxial growth, SGOI, and/or MBE epitaxial growth of various appropriate silicon alloys (e.g., such as silicon germanium).

In addition to the doping at first area 123 and second area 125 described above, according to embodiments doping can be done in a "self-aligned" manner, such as a manner without additional masking. For instance, first dielectric 140 shown in FIG. 4 may be deposited over wafer 300 of FIG. 3 (e.g., including first area 123 and second area 125). Then, resist (e.g., such as a photoresist) may be spun and exposed over P-well 122. The resist is then removed and first dielectric 140 is etched to expose the first area 123 over P-well 122. Next, ion implantation can be performed to dope P-well 122 (e.g., such as with dopants as described above for doping first area 123). The remaining resist is stripped from wafer 300 and first layer 150 is selectively deposited as shown in FIG. 4. Moreover, a similar process can be used when forming second dielectric 142 and second layer 160, to dope second area 125 (e.g., such as with dopants as described above for doping second area 125), and resulting in the structure shown in FIG. 5. It can be appreciated that the order of certain "self-aligned" doping processes mentioned above can be reversed.

Also, according to embodiments, a distinction is drawn with respect to the increasing percentage or grading concentration of germanium in the relaxed silicon germanium substrate material (e.g., such as substrate material 120 having a percentage of Ge increase such as a percentage of Ge increasing via smooth or step grading) and the sudden increase in germanium at an interface between the graded relaxed silicon germanium substrate material and the channel SiGe (e.g., such as the sudden increase between second layer 160 which has a greater percentage of Ge at second area 125 than substrate material 120 by, for example, between 10 percent and 30 percent.) Thus, the channel SiGe material (e.g., second layer 160) may form a coherent alignment with the graded relaxed substrate material SiGe (e.g., such as at second area 125 of substrate material 120; where substrate material 120 may also be in coherent alignment within the graded substrate, such as along thickness H3), but will experience compressive strains 162 and 164 because of the jump in percentage in Ge between the channel material and the substrate material, at the substrate/channel interface (e.g., such as where second area 125 contacts second layer 160). Furthermore, although descriptions above for forming second layer 160 are focused on forming a layer of silicon germanium, according to embodiments, second layer 160 may be formed of various appropriate silicon alloy materials, such as by selective epitaxial CVD of such a material.

It is noted that first layer 150 and/or second layer 160 may be formed after formation of electronically isolating regions between first area 123 and second area 125 (e.g., such as prior to forming STI material 130) so that high temperature processes for forming electronically isolating regions will not be a factor in reducing selected thickness of or in inducing relaxation of a tensile strain in first layer 150 and/or a compressive strain in second layer 160. Moreover, it is appreciated that selective formation of first layer 150 and/or second layer 160 on first area 123 and second area 125 may include a size of first area 123 and a size of second area 125 selected to be small enough to increase or provide sufficient stability of first layer 150 to allow tensile strain deposition on a buffer of relaxed graded silicon germanium substrate material 120 with a selected percentage of germanium at first area 123, as well as to allow compressive strained deposition of second layer 160 on a buffer of relaxed graded silicon germanium substrate material 120 having a selected percentage of germanium at second area 125 which is approximately equal to the percentage of germanium at first area 123.

Also, first layer 150 may be doped with boron and/or aluminum to form a P-type channel region having an electrically positive charge, (e.g., see first dielectric layer 140 above) and second layer 160 may be doped with phosphorous, arsenic, and/or antimony to form an N-type channel region having an electrically negative charge. For example, first layer 150 and/or second layer 160 may be doped by introducing the dopants identified above during deposition of, or doping with the dopants identified above after deposition of first layer 150 and/or second layer 160. Thus, first layer 150 and/or second layer 160 may be doped with a sufficient amount of an appropriate type of dopant to form a P-type channel region and/or a P-type channel region, respectively, such as for a NMOS and/or PMOS device, respectively, such as for a CMOS circuit. Specifically, for example, first layer 150 and/or second layer 160 may be doped with between 1.0 exponential to the 17th and 1.0 exponential to the 18th of dopant particles per cubic centimeter of channel material. Thus, such doping may be performed with less than an amount of dopant particles that would result in degraded carrier mobility due to excessive impurity scattering.

After formation of second layer 160, a third dielectric layer may be formed over first layer 150 and different second layer 160. For example, FIG. 6 shows the semiconductor substrate of FIG. 1 after forming a layer of high dielectric constant material over the selectively deposited silicon and the selectively deposited silicon germanium material. FIG. 6 shows third dielectric layer 144, such as a layer of dielectric material having a relatively high dielectric constant (e.g. "a high K dielectric", having a K greater than or equal to 3.9 and/or the K of silicon dioxide ($SiO_2$)), which may be between 2 and 4 nano-meters in thickness, formed over first layer 150 and second layer 160. Third dielectric layer 144 may be formed by atomic layer deposition (ALD) such as by ALD of silicon dioxide ($SiO_2$), hafnium oxide (HfO), hafnium silicate (Hf-$SiO_4$), hafnium disilicate ($HfSi_4O_7$), zirconium oxide (ZrO), zirconium silicate ($ZrSiO_4$), tantalum oxide ($Ta_2O_5$).

FIG. 7 shows the semiconductor substrate of FIG. 1 after forming an NMOS device in the selectively deposited silicon material, and a PMOS device in the selectively deposited silicon germanium material. FIG. 7 shows first layer 150 doped to form P-type channel region 176, and second layer 160 doped to form N-type channel region 186. FIG. 7 also shows NMOS device 178 having N-type gate electrode 170 on a surface of third dielectric layer 144 over first layer 150 (e.g., N-type gate electrode 170 having an electrically negative charge), N-type first junction region 172 and second junction region 174 in first layer 150 adjacent to N-type gate electrode 170 (e.g., such as N-type first junction region 172 and second junction region 174 having an electrically negative charge). FIG. 7 also shows NMOS spacers 712 and 714 formed on surfaces of N-type gate electrode 170. Likewise, FIG. 7 shows PMOS device 188 having P-type gate electrode 180 on a surface of third dielectric layer 144 over second layer 160 (e.g., such as wherein P-type gate electrode 180 has an electrically positive charge), and P-type first junction region 182 and P-type second junction region 184 in second layer 160 adjacent P-type gate electrode 180 (e.g., such as where P-type first junction region 182 and second junction region 184 have an electrically positive charge). FIG. 7 also shows PMOS spacers 412 and 414 formed on surfaces of P-type gate electrode 180.

Thus, according to embodiments, first layer 150 may be formed suitable as P-type channel region 176 for NMOS device 178 on first area 123 of substrate material 120, first layer 150 having a first material with a first lattice spacing different (e.g., such as smaller) than a substrate lattice spacing of a substrate material defining a first interface surface of the substrate (e.g., such as at first area 123). Similarly, second layer 160 may be formed suitable as N-type channel region 186 for PMOS device 188 on a different second area 125 of substrate material 120, second layer 160 having a different second material with a second lattice spacing different than the first lattice spacing of the first layer and different than the substrate lattice spacing of the substrate material (e.g., such as by the second lattice spacing having a larger lattice spacing than the substrate material), where the second layer defines a second interface surface of the substrate (e.g., such as at second area 125). Notably, the difference between the first lattice spacing of first layer 150 and the substrate lattice spacing at first area 123 may define a tensile strain in the direction of arrows 152 and 154 in first layer 150, which is sufficient to enhance or increase electron mobility in first layer 150 (e.g., such as by at least 50, 75, 80, or 85 percent). Similarly, the difference between the second lattice spacing of second layer 160 and the substrate lattice spacing at second area 125 may define a compressive strain in the direction shown by arrows 162 and 164 in second layer 160, which is sufficient to enhance or increase hole mobility in second layer 160 (e.g., such as by at least 50, 80, 90, 100, or 110 percent).

Furthermore, it can be appreciated that the tensile strain in first layer 150 may be a bi-axial tensile strain such as to stretch or expand first layer 150 outward in the direction of arrows 152 and 154, as well as in the direction of an arrow pointing towards the viewer and away from the cross sectional surface of first layer 150 shown in FIGS. 5-7. Likewise, it can be appreciated that the compressive strain in second layer 160 may be a bi-axial compressive strain such as to contract or squeeze second layer 160 inward in the direction of arrows 162 and 164, as well as in the direction of an arrow pointing away from the viewer and towards the cross sectional surface of second layer 160 shown in FIGS. 5-7. More particularly, the thickness of substrate material 120, and concentration of germanium at upper surface 129, thickness of first layer 150, thickness of second layer 160 and percentage of germanium in second layer 160 may be selected as described herein so that a two dimensional coherent tensile strain is induced in first layer 150 from bonding of first layer 150 at first area 123 to substrate material 120 (e.g., such as a coherent strain caused by the atomic structure of the material of first layer 150 lining up with the atomic structure of substrate material 120 at first area 123, even though the material of first layer 150 has a lattice alignment of a smaller lattice spacing than that of first area 123). Similarly, the selections above can be made so that a two dimensional coherent compressive strain is induced in second layer 160 from bonding of second layer 160 to substrate material 120 at second area 125 (e.g., such as a coherent strain caused by the atomic structure of the material of second layer 160 lining up with the atomic structure of substrate material 120 at second area 125, even though the material of second layer 160 has a lattice alignment of a larger lattice spacing than that of second area 125).

Consequently, for a substrate material of $Si_{1-X}Ge_X$, a first material of Si, and a second material of $Si_{1-Y}Ge_Y$, where 10X represents the percentage of germanium in the graded silicon germanium substrate material 120 at first area 123 and second area 125, and 10Y represents the percentage of germanium in second layer 160 proximate to second area 125, X may be less than Y. For instance, X may be between 0.1 and 0.3, while Y is between 0.2 and 0.6. In some embodiments, Y may be between 0.1 and 0.3 larger than X. Moreover, in one embodiment, X may be 0.2 and Y may be 0.5.

In the foregoing specification, the invention has been described with reference to specific embodiments thereof. However, it will be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
   a first layer of a silicon material suitable as a first channel for a first circuit device on a first interface surface of a first silicon alloy material;
   wherein a lattice spacing of the silicon material is smaller than a lattice spacing of the first silicon alloy material at the first interface surface;
   a second layer of a second silicon alloy material suitable as a second channel for a second circuit device on a second interface surface of the first silicon alloy material;
   wherein a lattice spacing of the second silicon alloy material is larger than a lattice spacing of the first silicon alloy material at the second interface surface, wherein the second silicon alloy material has between 10 and 30 percent more Germanium than the first silicon alloy material, wherein the first silicon alloy material is a substrate of graded relaxed silicon Germanium material; and wherein the graded relaxed silicon Germanium material has one of (1) a thickness of between 1 micrometer and 3 micrometers in thickness, and a grading concentration of Germanium that increases from 0 percent to between 10 percent and 30 percent at the first and second interface surfaces, or (2) a grading concentration rate that increases at between 5 percent Ge and 15 percent Ge per micrometer in a direction towards the first and second interface surfaces; and
   a gate dielectric layer in contact with the Silicon material and the second Silicon alloy material.

2. The apparatus of claim 1, wherein the first silicon alloy material comprises Germanium in an amount of between 10 and 30 percent Germanium; wherein the second silicon alloy material comprises Germanium in an amount of between 20 and 60 percent Germanium; and wherein the first silicon alloy material has a lower percent of Germanium than the second silicon alloy material.

3. The apparatus of claim 1, wherein the first layer of a silicon material is a selectively grown material and is on a first area of the first interface surface; and wherein the second layer of a second silicon alloy material is a selectively grown material and is on a second area of the second interface surface.

4. The apparatus of claim 3, wherein the layer of silicon material is an epitaxial layer of silicon material having a thickness of between 10 nano-meters and 20 nano-meters in thickness; and wherein the layer of second silicon alloy material is an epitaxial layer of second silicon alloy material having a thickness of between 10 nano-meters and 20 nano-meters in thickness.

5. The apparatus of claim 1, wherein the gate dielectric layer is formed of one of silicon dioxide ($SiO_2$), hafnium oxide (HfO), hafnium silicate ($HfSiO_4$), hafnium disilicate ($HfSi_4O_7$), zirconium oxide (ZrO), zirconium silicate ($ZrSiO_4$), or tantalum oxide ($Ta_2O_5$).

6. The apparatus of claim 1, further comprising an electronically insulating material between the first area and the second area;
   the first silicon alloy material doped at the first area with one of boron or aluminum to form a P-type well region having an electrically positive charge; and
   the first silicon alloy material doped at the second area with one of phosphorous, arsenic, or antimony to form an N-type well region having an electrically negative charge.

7. The apparatus of claim 6, further comprising:
   the first layer doped with one of boron and aluminum to form a P-type channel region having an electrically positive charge;
   the second layer doped with one of phosphorous, arsenic, and antimony to form an N-type channel region having an electrically negative charge;
   an N-type gate electrode on a surface of the gate dielectric layer over the first layer;
   an N-type first junction region and an N-type second junction region in the first layer adjacent the N-type gate electrode;
   wherein the gate electrode is a P-type gate electrode on a surface of the gate dielectric layer over the second layer; and
   a P-type first junction region and an P-type second junction region in the second layer adjacent the P-type gate electrode.

8. An apparatus comprising:
   a selectively grown layer of a silicon material suitable as a channel for a circuit device on an area of a first silicon alloy material defining an interface surface of a single layer of graded relaxed silicon Germanium material, wherein the layer of silicon material is an epitaxial layer of silicon material having a thickness of between 10 nano-meters and 20 nano-meters in thickness, wherein the graded relaxed silicon Germanium material has one of (1) a thickness of between 1 micrometer and 3 micrometers in thickness, (2) a grading concentration of Germanium that increases from 0 percent to between 10 percent and 30 percent at the interface surface, or (3) a grading concentration rate that increases at between 5 percent Ge and 15 percent Ge per micrometer in a direction towards the interface surface;
   wherein a lattice spacing of the silicon material is smaller than a lattice spacing of the first silicon alloy material at the interface surface; and
   a gate dielectric layer in contact with the selectively grown Silicon material.

9. The apparatus of claim 8, wherein the first silicon alloy material comprises Germanium in an amount of between 10 and 30 percent Germanium.

10. The apparatus of claim 8, wherein the gate dielectric layer is foamed of one of hafnium oxide (HfO), hafnium silicate (HfSiO$_4$), hafnium disilicate (HfSi$_4$O$_7$), zirconium oxide (ZrO), zirconium silicate (ZrSiO$_4$), or tantalum oxide (Ta$_2$O$_5$).

11. The apparatus of claim 8, further comprising an electronically insulating material beside the area;
the single layer material doped at the area with one of boron and aluminum to form a P-type well region having an electrically positive charge;
the layer of material doped with one of boron and aluminum to form a P-type channel region having an electrically positive charge;
an N-type gate electrode on a surface of the gate dielectric layer over the layer of silicon material; and
an N-type first junction region and an N-type second junction region in the layer of silicon material adjacent the N-type gate electrode.

12. An apparatus comprising:
a selectively grown layer of a second silicon alloy material suitable as a channel for a circuit device on an area of a first silicon alloy material defining an interface surface of a substrate of graded relaxed silicon Germanium material, wherein the layer of second silicon alloy material is an epitaxial layer of second silicon alloy material having a thickness of between 10 nano-meters and 20 nano-meters in thickness, wherein the graded relaxed silicon Germanium material has one of (1) a thickness of between 1 micrometer and 3 micrometers in thickness, (2) a grading concentration of Germanium that increases from 0 percent to between 10 percent and 30 percent at the interface surface, or (3) a grading concentration rate that increases at between 5 percent Ge and 15 percent Ge per micrometer in a direction towards the interface surface;
wherein a lattice spacing of the second silicon alloy material is larger than a lattice spacing of the first silicon alloy material at the interface surface, wherein the second silicon alloy material has between 10 and 30% more germanium than the first silicon alloy material; and
a gate dielectric layer in contact with the selectively grown second Silicon alloy material.

13. The apparatus of claim 12, wherein the second silicon alloy material comprises Germanium in an amount of between 20 and 60 percent Germanium; and wherein the first silicon alloy material has a lower percent of Germanium than the second silicon alloy material.

14. The apparatus of claim 12, wherein the gate dielectric layer is formed of one of hafnium oxide (HfO), hafnium silicate (HfSiO$_4$), hafnium disilicate (HfSi$_4$O$_7$), zirconium oxide (ZrO), zirconium silicate (ZrSiO$_4$), or tantalum oxide (Ta$_2$O$_5$).

15. The apparatus of claim 12, wherein the first silicon alloy material comprises Germanium in an amount of between 10 and 30 percent Germanium.

16. The apparatus of claim 12, further comprising an electronically insulating material beside the area;
the substrate doped at the area with one of phosphorous, arsenic, and antimony to form an N-type well region having an electrically negative charge;
a P-type gate electrode on a surface of the gate dielectric layer over the layer of second silicon alloy material; and
a P-type first junction region and an P-type second junction region in the layer of second silicon alloy material adjacent the P-type gate electrode.

17. An apparatus comprising:
a selectively grown layer of a silicon material suitable as a first channel for a first circuit device on a first area of a first silicon alloy material defining a first interface surface of a single layer of graded relaxed silicon Germanium material;
wherein a lattice spacing of the silicon material is smaller than a lattice spacing of the first silicon alloy material at the first interface surface; and
wherein the graded relaxed silicon Germanium material has one of (1) a thickness of between 1 micrometer and 3 micrometers in thickness, (2) a grading concentration of Germanium that increases from 0 percent to between 10 percent and 30 percent at the first interface surface, or (3) a grading concentration rate that increases at between 5 percent Ge and 15 percent Ge per micrometer in a direction towards the first interface surface.

18. The apparatus of claim 17, wherein the first silicon alloy material comprises Germanium in an amount of between 10 and 30 percent Germanium.

19. The apparatus of claim 17, further comprising a gate dielectric on the layer of silicon material wherein the gate dielectric layer is formed of one of silicon dioxide (SiO$_2$), hafnium oxide (HfO), hafnium silicate (HfSiO$_4$), hafnium disilicate (HfSi$_4$O$_7$), zirconium oxide (ZrO), zirconium silicate (ZrSiO$_4$), or tantalum oxide (Ta$_2$O$_5$).

* * * * *